United States Patent [19]

Choi et al.

[11] Patent Number: 5,751,632
[45] Date of Patent: May 12, 1998

[54] DEVICE FOR AND METHOD OF SENSING DATA OF MULTI-BIT MEMORY CELL

[75] Inventors: Woong Lim Choi, Kwachon-si; Kyeong Man Ra, Chungcheongbuk-do; Kyung Myung Hur, Cheongju-si, all of Rep. of Korea

[73] Assignee: LG Semicon Co., Ltd., Chungcheongbuk-Do, Rep. of Korea

[21] Appl. No.: 852,497

[22] Filed: May 7, 1997

[30] Foreign Application Priority Data

Nov. 19, 1996 [KR] Rep. of Korea ............ 55272/1996

[51] Int. Cl.$^6$ ............................................. G11C 11/34
[52] U.S. Cl. .................. 365/185.03; 365/185.2; 365/185.21
[58] Field of Search ............ 365/185.03, 185.2, 365/185.21

[56] References Cited

U.S. PATENT DOCUMENTS

| | | | |
|---|---|---|---|
| 5,218,569 | 6/1993 | Banks | 365/189.01 |
| 5,261,984 | 11/1993 | Noguchi et al. | 365/185 |
| 5,424,978 | 6/1995 | Wada et al. | 365/184 |
| 5,508,958 | 4/1996 | Fazio et al. | 365/185.19 |
| 5,566,111 | 10/1996 | Choi | 365/185.22 |
| 5,608,669 | 3/1997 | Mi et al. | 365/185.19 |
| 5,638,320 | 6/1997 | Wong et al. | 365/185.03 |
| 5,673,221 | 9/1997 | Calligaro et al. | 365/168 |

*Primary Examiner*—David C. Nelms
*Assistant Examiner*—Hien Nguyen
*Attorney, Agent, or Firm*—Morgan, Lewis & Bockius LLP

[57] ABSTRACT

A device for and method of sensing data of a multi-bit memory cell includes a memory cell having a gate, a source and a drain, the memory cell being programmed with at least two voltage levels, a voltage generator coupled to the memory cell and providing the gate of the memory cell with a voltage, the voltage being increased linearly, a sensing amplifier coupled to the memory cell and generating a sensing signal when a drain voltage of the memory cell is lower than a reference voltage, a voltage detector coupled to the sensing amplifier and the voltage generator and detecting synchronously a gate voltage of the memory cell with the sensing signal of the sensing amplifier, and an A/D converter coupled to the voltage detector and translating the gate voltage detected in the voltage detector into a digital value.

10 Claims, 5 Drawing Sheets

5,751,632

DEVICE FOR AND METHOD OF SENSING DATA OF MULTI-BIT MEMORY CELL

This application claims the benefits of Korean Patent Application No. 55272 filed Nov. 19, 1996, which is hereby incorporated by reference.

BACKGROUND OF THE INVENTION

1. Field of the Invention

The present invention relates to a device and method of reading information stored in a semiconductor device, and more particularly, to a data sensing device and method for a multi-bit memory cell. Although the present invention is suitable for a wide range of application, it is particularly suitable for reading data from a memory cell programmed in two or multi-level voltages.

2. Discussion of the Related Art

In general, semiconductor memory devices are classified into two groups: a volatile memory and a nonvolatile memory. The volatile memory cannot maintain data without continuous power dissipation, whereas the non-volatile memory permanantly retains its contents even when power is shut off. Nevertheless, RAM's, volatile memory devices, are frequently used because of the capability of repetitive data writing and reading.

Nonvolatile memories include a ROM (Read Only Memory), an EPROM(Erasable Programmable ROM), and an EEPROM(Electrically Erasable Programmable ROM). A ROM is a memory device for storing data permanently or in non-erasable form. An EPROM and an EEPROM are read-only memory devices in both of which stored data can be erased and reprogrammed with appropriate voltage pulses in the same manner. Data is erased in a different manner depending upon the memory device. Data in EPROM is erased by ultraviolet light, and the data in an EEPROM is erased by electric means.

With the development of the computer industry, a memory device having a larger capacity is in great demand. For example, a DRAM is mostly used as a mass storage medium. The DRAM, however, needs constant refreshing to retain data for a period of time because its storage capacitor has a limited capacity. Accordingly, many studies have been made on the EEPROM which does not have to refresh its contents and hence can be a good substitute for the DRAM.

However, the EEPROM memory device can only read the alternative of "1" or "0" in one memory cell and therefore its degree of integration is limited to an one-to-one relation with the number of memory cells. For this reason, the high price of the memory per bit is a most serious problem when the EEPROM is used for a data storage.

To solve this problem of the EEPROM, a multi-bit cell has been actively studied in recent years. At least two bits of information can be stored in a multi-bit cell, so that the degree of integration in storing data into a memory chip is improved without increasing a size of the memory cell.

The multi-bit cell is programmed by multi-level threshold voltages. For example, to store a two-bit of data, each cell is programmed by 4 ($2^2$=4) threshold voltage levels, which logically correspond to 00, 01, 10, and 11. To program the multi-bit memory cell by multilevel threshold voltage and thus increase the number of bits per cell, the threshold voltage levels should be precisely controlled to reduce variations from the desired voltage levels. Also, precise data sensing is required at high speed.

A data sensing device of a conventional multi-bit memory cell will be described with reference to the appended drawing.

FIG. 1 is a diagram showing a construction of a data sensing device of a conventional multi-bit memory cell, and FIG. 2 is a graph illustrating its operation. The data sensing method of the conventional multi-bit memory cell includes the steps of applying a certain voltage to a control gate to read data and determining the drain current from the applied voltage to read the multi-bit memory data.

Referring to FIG. 1, the conventional unit cell of the EEPROM includes a floating gate FG, a control gate CG, a source region S and a drain region D, wherein the drain region D is connected to a sensing amplifier SA having a plurality of reference currents.

The memory cell is programmed by multi-level threshold voltages. For example, in 2-bit data writing as shown in FIG. 2, the memory cell is programmed by one of four threshold voltages, such as 0 V, $V_{T,0}$, $V_{T,1}$, and $V_{T,2}$ in the floating gate FG.

After a constant voltage is applied to the source region S, a voltage $V_{READ}$ is selectively applied to the control gate CG in the memory cell to be read. Then, a drain current $K_2$ corresponding to the voltage $V_{READ}$ is generated in the sensing amplifier SA according to the programmed state of the floating gate FG. The sensing amplifier SA compares a multilevel reference current with the drain current received from the memory cell.

As shown in FIG. 2, if the data is programmed by a threshold voltage $V_{T,0}$ at the floating gate FG of the memory cell to be read in an EEPROM, a drain current $I_{R1}$ corresponding to the voltage $V_{T,0}$ is transmitted to the sensing amplifier SA. But, when the data is programmed with a voltage $V_{T,1}$ in the floating gate FG, a drain current $I_{R2}$ corresponding to the voltage $V_{T,1}$ is generated to the sensing amplifier SA, and when programmed with a voltage $V_{T,2}$, a drain current $I_{R3}$ corresponding to the voltage $V_{T,2}$ is generated to the sensing amplifier SA. Subsequently, the sensing amplifier SA receives the drain current from the memory cell and compares it with multi-level reference currents to perform the data sensing.

According to the prior art, where a constant voltage $V_c$ for a readout is applied to the control gate of the memory cell and the sensing amplifier compares the drain current generated from the memory cell with multi-level reference currents so as to read the data, the conventional multi-bit memory cell have several problems.

First, the sensing amplifier has to contain multi-level reference currents because it reads data by comparing a current generated from the memory cell with reference currents having different levels, so that a cell size becomes larger, especially in a page mode read where capacity of about 128 bits is required.

Second, power consumption increases because a plurality of reference currents must be applied to the multi-bit memory cell.

SUMMARY OF THE INVENTION

Accordingly, the present invention is directed to a data sensing device and method of a multi-bit memory cell that substantially obviates one or more of the problems due to limitations and disadvantages of the related art.

An object of the present invention is to provide a data sensing device and method of a multi-bit memory cell having reduced chip size and power consumption.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a data sensing device of a multi-bit memory cell includes a memory cell having a gate, a source and a drain, and programmed at multi levels, a voltage generator for providing the gate of the memory cell with a voltage increasing in proportion, a sensing amplifier for generating a sensing signal when the voltage of the drain is lower than a reference voltage, a voltage detector for detecting the voltage of the gate in exact synchronism with the sensing signal of the sensing amplifier, and an A/D converter for translating the detected voltage of the gate into a digital data.

In another aspect of the present invention, a method of sensing data of the multi-bit memory cell includes the steps of providing a control gate of the memory cell with a voltage increasing in proportion, comparing the voltage of the drain of the memory cell with a reference voltage, generating a sensing signal when the voltage of the drain of the memory cell is lower than the reference voltage, detecting the voltage of the control gate in exact synchronism with the sensing gate, and converting the detected voltage to a digital data.

In another aspect of the present invention, a data sensing device of a multi-bit memory cell includes a memory cell having a gate, a source and a drain, the memory cell being programmed with at least two voltage levels, a voltage generator coupled to the memory cell and providing the gate of the memory cell with a voltage, the voltage being increased linearly, a sensing amplifier coupled to the memory cell and generating a sensing signal when a drain voltage of the memory cell is lower than a reference voltage, a voltage detector coupled to the sensing amplifier and the voltage generator and detecting synchronously a gate voltage of the memory cell's gate voltage in synchronism with the sensing signal of the sensing amplifie, and an A/D converter coupled to the voltage detector and translating the gate voltage detected in the voltage detector into a digital value.

In a further aspect of the present invention, a data sensing method of a multi-bit memory cell includes the steps of providing a control gate of the memory cell with a voltage, the voltage being increased linearly, comparing a drain voltage of the memory cell with a reference voltage, generating a sensing signal when the drain voltage drain of the memory cell is lower than the reference voltage, detecting synchronously the control gate voltage with the sensing signal, and converting the detected voltage into a digital value.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
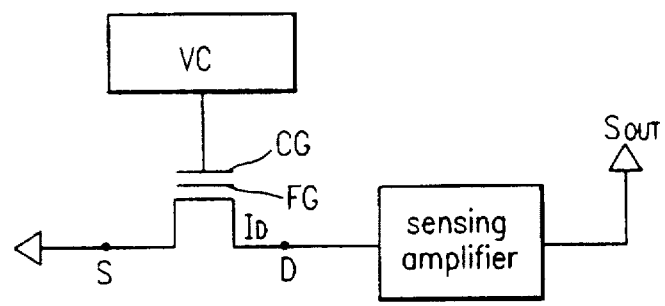
FIG. 1 is a diagram showing a construction of a data sensing device of a conventional multi-bit memory cell.
Figure 2:
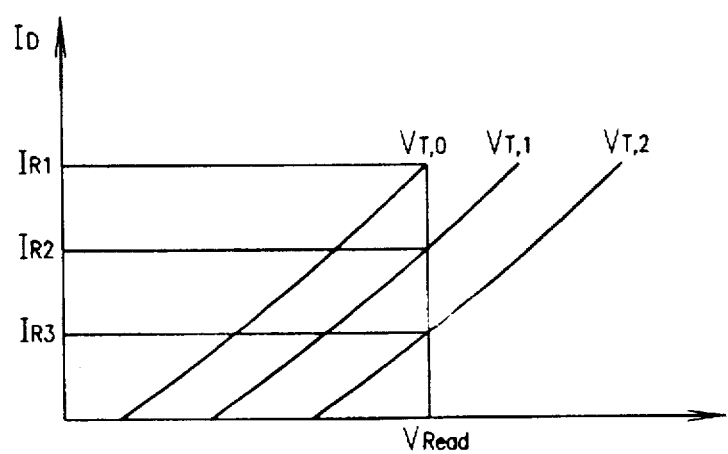
FIG. 2 is a graph for illustrating the operation of the data sensing device of the conventional multi-bit memory cell.
Figure 3:
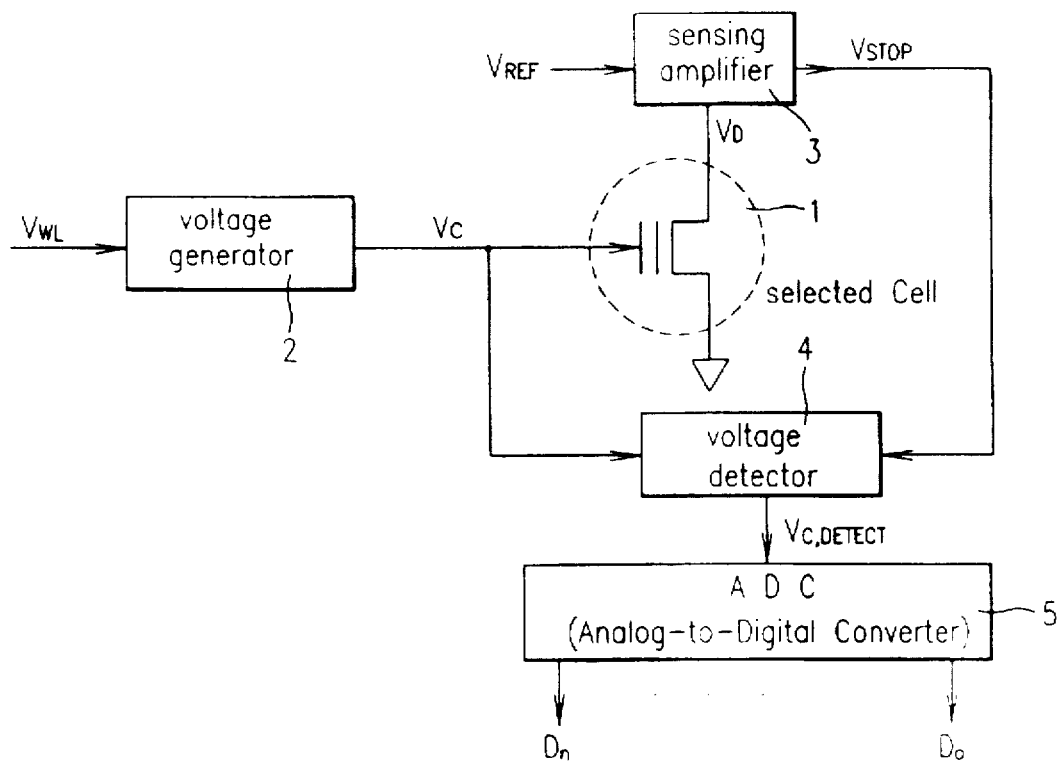
FIG. 3 is a block diagram showing a construction of a data sensing device of a multi-bit memory cell according to a preferred embodiment of the present invention.
Figure 4:
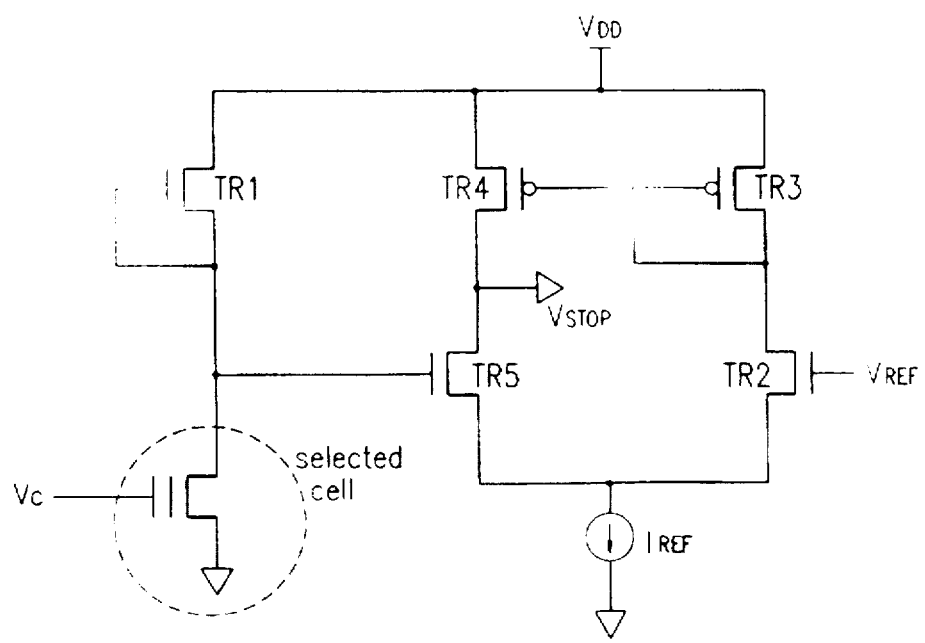
FIG. 4 is a circuit diagram of a sensing amplifier of the present invention.
Figure 7:
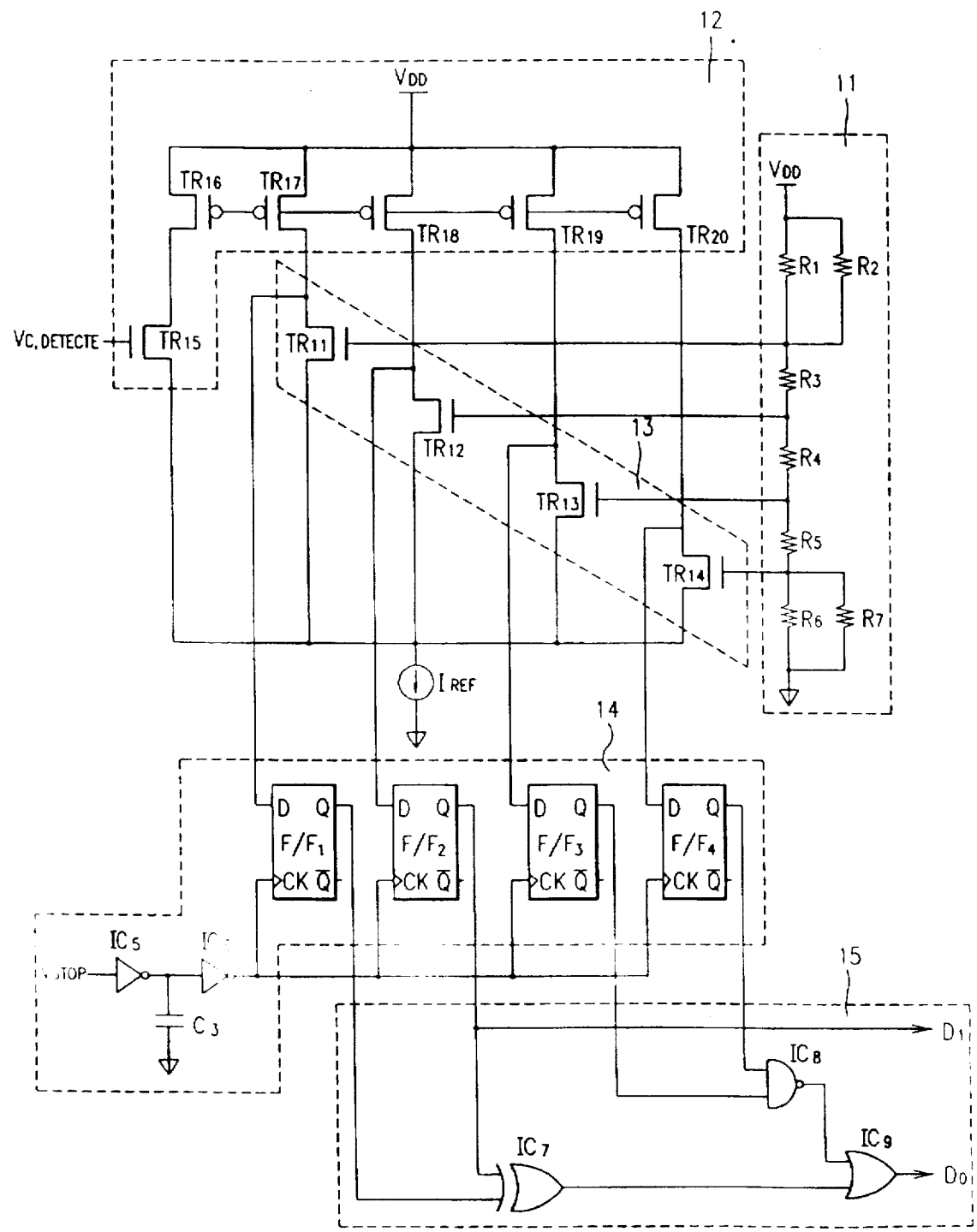
FIG. 7 is a circuit diagram of an A/D converter of the present invention.

FIG. 3 is a block diagram showing a construction of a data sensing device of a multi-bit memory cell according to a preferred embodiment of the present invention, and FIGS. 4 and 7 are circuit diagrams of a sensing amplifier and an A/D converter as shown in FIG. 3, respectively.

Referring to FIG. 3, the data sensing device for sensing data of the multi-bit memory cell according to the present invention includes a flash memory cell 1 having a control gate, a floating gate, a source and a drain, and programmed with at least two threshold voltage levels, a voltage generator 2 providing the control gate of the memory cell 1 with a variable voltage, a sensing amplifier 3 connected to the drain of the memory cell 1 and sensing the voltage of the drain to generate a sensing signal when the variable voltage of the voltage generator 2 is applied to the control gate of the memory cell 1, a voltage detector 4 connected to the output terminals of the voltage generator 2 and the sensing amplifier 3 and detecting the voltage applied to the control gate of the memory cell 1 when the voltage of the drain of the memory cell 1 is lower than a reference voltage, and an A/D converter 5 connected to the voltage detector 4 and translating the detected voltage of the gate into corresponding digital data to generate data from the memory cell.

Referring to FIG. 4, the sensing amplifier 3 has a construction the same as a general sensing amplifier. The sensing amplifier 3 includes a p-type first transistor TR1 having a drain connected to a constant voltage $V_{DD}$ and a source and a gate connected to the drain of the memory cell, an n-type second transistor TR2 having a gate connected to the reference voltage $V_{REF}$ and a source connected to a ground terminal, a p-type third transistor TR3 having a drain connected to the constant voltage $V_{DD}$ and a gate and a source connected to the source of the second transistor TR2, a p-type fourth transistor TR4 having a drain connected to the constant voltage $V_{DD}$, a gate connected to the gate of the third transistor TR3, and a source connected to an output terminal, and an n-type fifth transistor TR5 having a drain connected to the output terminal, a gate connected to the drain of the memory cell, and a source connected to the ground terminal.

Figure 5:
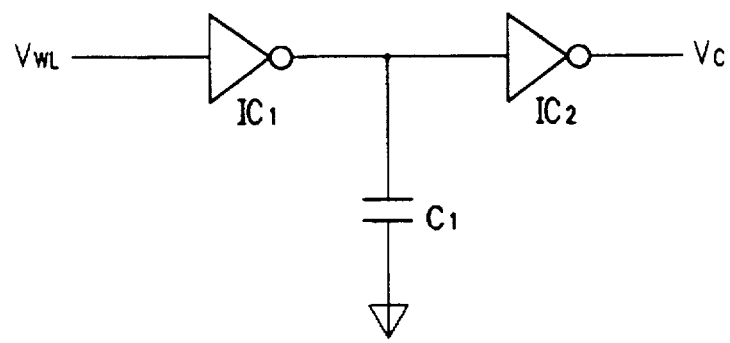
FIG. 5 is a circuit diagram of a reference voltage generator the present invention.

As shown in FIG. 5, the voltage generator 2 includes first and second inverters IC1 and IC2 connected to each other in series, and a capacitor C1 provided between the first and second inverters IC1 and IC2 and connected to a ground terminal.

Figure 6:
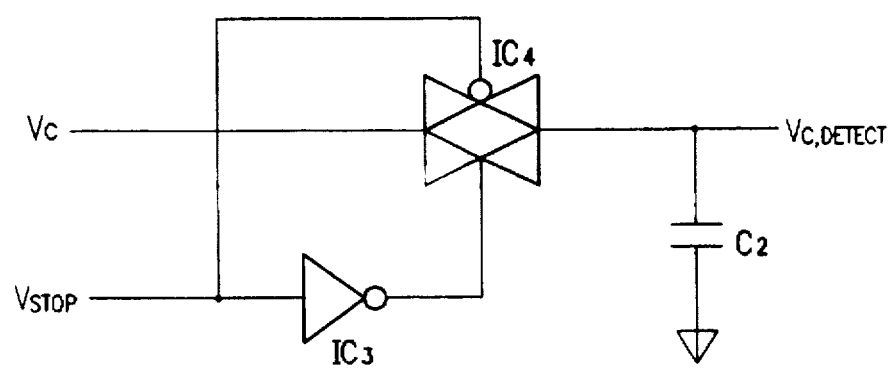
FIG. 6 is a circuit diagram of a voltage detector the present invention.

The voltage detector 4 shown in FIG. 6, includes a third inverter IC3 converting a direct current of the output signal generated from the sensing amplifier 3 into alternating current, a switching device IC4 switching output voltage of the voltage generator 2 according to the output signals of the sensing amplifier 3 and the third inverter IC3 to generate a detected signal, and a second capacitor C2 smoothing the detected signal.

As shown in FIG. 7, the A/D converter 5 includes a reference voltage generator 11 including a plurality of resistances R1 to R7 and providing a plurality of reference voltages (e.g., four reference voltages for a two-bit memory cell) varying proportionally in magnitude, a first switch 12 including an n-type transistor TR15 and a plurality of p-type transistors TR16 to TR20, and switching a plurality of constant voltages (e.g., four voltages for a two-bit memory cell) according to the output signal of the voltage detector 4, a second switch 13 including a plurality of n-type transistors TR11 to TR14 and switching the plurality of constant voltages (e.g., four voltages for a two-bit memory cell) generated from the first switch into the respective ground terminals according to the output signal of the reference voltage generator 11, a latch 14 including inverters IC5 and IC6, the capacitor C3 and a plurality of flip-flops F/F1 to F/F4, and latching the respective constant voltages generated from the first switch 12 using the output signal of the sensing amplifier 3 as a clock signal, and an encoder 15 including an exclusive OR gate IC7, an NAND gate IC8 and an OR gate IC9, and encoding the output signal from the latch 14.

The A/D converter shown in FIG. 7 demonstrates that the two-bit memory cell is programmed with threshold voltages of four levels. For example, to sense an N-bit memory cell, the reference voltage 11 generates 2N reference voltages, the first and second switches 12 and 13 switch 2N constant voltages, the latch 14 includes 2N flip-flops, and the encoder 15 encodes N bit data.

Figure 8:
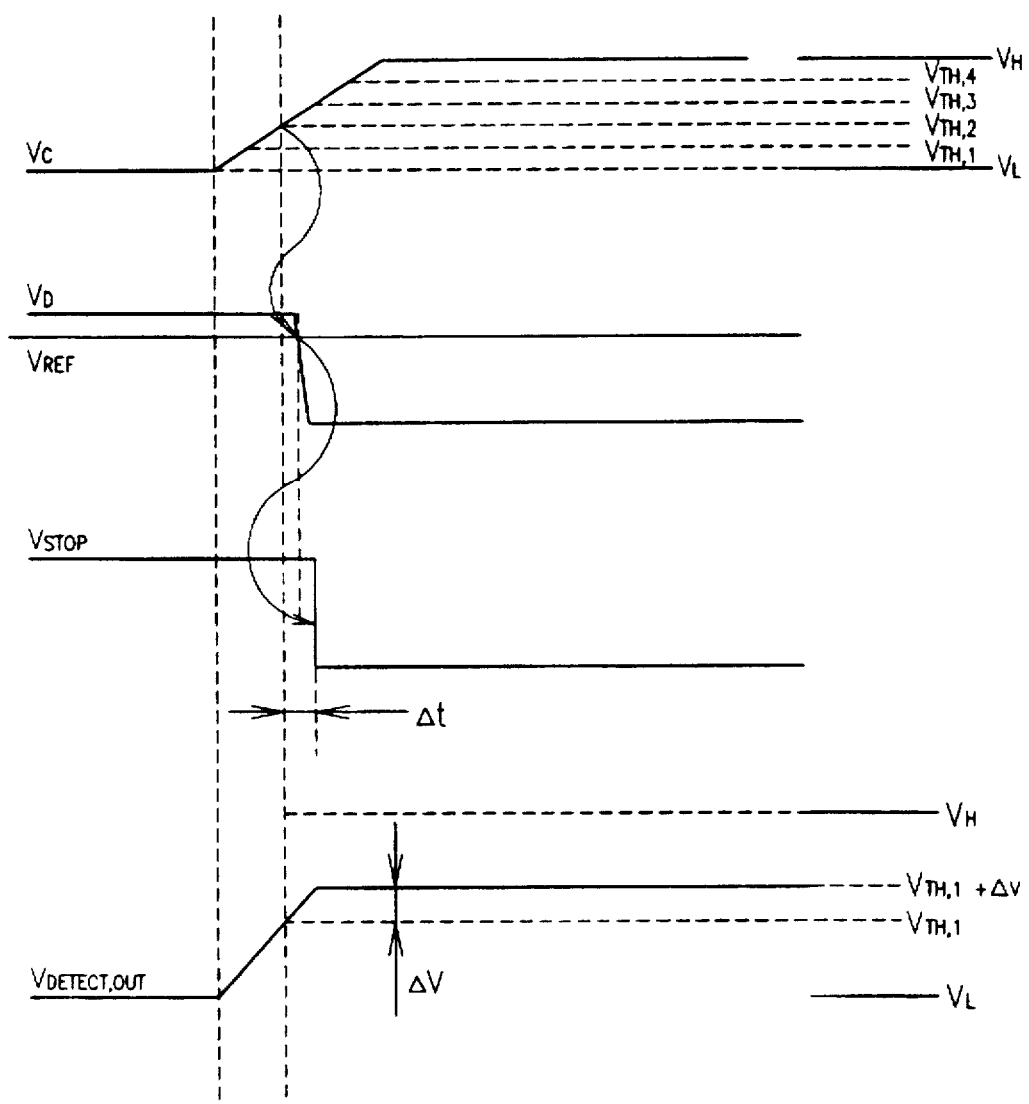
FIG. 8 is a timing diagram illustrating the operation of the data sensing device of the multi-bit memory cell according to the preferred embodiment of the present invention.

FIG. 8 is a timing diagram illustrating the operation of the data sensing device of the multi-bit memory cell according to the preferred embodiment of the present invention.

In a data sensing method of the multi-bit memory cell according to the present invention, the voltage generator 2 provides the control gate of the memory cell 1 with a voltage increasing proportionally and the sensing amplifier 3 connected to the drain of the memory cell 1 compares the drain voltage $V_D$ with the reference voltage $V_{REF}$.

When the voltage generated from the voltage generator 2 is higher than the threshold voltage programmed in the memory cell 1, a channel is formed between the source and the drain to turn on the memory cell 1 and make a current flow through the drain. Thus, the drain voltage $V_D$ is lowered below the reference voltage so that the sensing amplifier 3 turns on the memory cell 1 to generate a "LOW" signal. The voltage detector 4 detects synchrously the voltage generated from the voltage generator 2 with the "LOW" signal from the sensing amplifier 3.

The detected voltage is then converted to a digital signal via the A/D converter 5. In this process, because of limited gains in the sensing amplifier 3, the sensing amplifier 3 can generate the "LOW" signal only after a delay time $\Delta t$ elapses, not at the moment that the drain voltage in the memory cell 1 is equal to the reference voltage of the sensing amplifier 3.

Due to this delay time, the voltage detector 4 actually detects a voltage higher than the intended voltage of the control gate (an instant voltage generated from the voltage generator and increased proportionally) by $\Delta V$. For this reason, the speed of the sensing amplifier 3 and the slope of the output voltage in the voltage generator 2 have to be regulated so that they are in the range where the voltage difference $\Delta V$ does not matter.

To describe the data sending method in further detail, supposed that the memory cell is programmed with a threshold voltage $V_{TH,2}$ as shown in FIG. 8, the drain voltage of the memory cell becomes "LOW" at the moment that the proportionally increasing output voltage of the voltage detector 4 becomes higher than the threshold voltage $V_{TH,2}$. Thus, the sensing amplifier 3 generates a "LOW" signal and instantly the voltage detector 4 provides a voltage applied to the control gate of the memory cell.

As a result, when neglecting the delay time $\Delta t$ and its resultant voltage difference $\Delta V$, the gate of the transistor TR15 in the A/D converter generates a voltage $V_c$ corresponding to the threshold voltage $V_{TH,2}$.

In a modification of the process, the voltage generator 2 may generate a voltage proportionally decreased to the control gate and the sensing amplifier 3 may produce a sensing signal when the drain voltage of the memory cell becomes higher than the reference voltage.

It will be apparent to those skilled in the art that various modifications and variations can be made in the data sensing device and method of a multi-bit memory cell according to the present invention without departing from the spirit or scope of the invention. Thus, it is intended that the present invention cover the modifications and variations of this invention provided they come within the scope of the appended claims and their equivalents.

What is claimed is:

1. A data sensing device of a multi-bit memory cell comprising:

a memory cell having a gate, a source and a drain, the memory cell being programmed with at least two voltage levels;

a voltage generator coupled to the memory cell and providing the gate of the memory cell with a voltage, the voltage being increased linearly;

a sensing amplifier coupled to the memory cell and generating a sensing signal when a drain voltage of the memory cell is lower than a reference voltage;

a voltage detector coupled to the sensing amplifier and the voltage generator and detecting synchronously a gate voltage of the memory cell with the sensing signal of the sensing amplifier; and an A/D converter coupled to the voltage detector and translating the gate voltage detected in the voltage detector into a digital value.

2. The device according to claim 1, wherein the sensing amplifier comprises:

a p-type first transistor having a drain connected to a constant voltage and a source and a gate connected to the drain of the memory cell;

an n-type second transistor having a gate connected to the reference voltage and a source connected to a ground terminal;

a p-type third transistor having a drain connected to the constant voltage and a gate and a source connected to the drain of the second transistor;

a p-type fourth transistor having a drain connected to the constant voltage, a gate connected to the gate of the third transistor, and a source connected to an output terminal; and an n-type fifth transistor having a drain connected to the output terminal, a gate connected to the drain of the memory cell, and a source connected to the ground terminal.

3. The device according to claim 1, wherein the voltage detector comprises:

an inverter inverting an output signal of the sensing amplifier;

a switching device coupled to the inverter and switching an output voltage of the voltage generator according to the output signals of the sensing amplifier and the inverter and generating a detected signal; and a capacitor coupled to the switching device and smoothing the detected signal.

4. The device according to claim 1, wherein the A/D converter comprises:

a first switch switching a plurality of constant voltages in response to an output signal of the voltage detector;

a second switch coupled to the first switch and switching the plurality of constant voltages generated from the first switch to a respective ground terminals in response to an output signal of the reference voltage generator;

a reference voltage generator coupled to the second switch and providing a plurality of reference voltages, the reference voltages proportionally varying in magnitude;

a latch coupled to the first switch and latching the respective constant voltages generated from the first switch using an output signal of the sensing amplifier as a clock signal; and an encoder coupled to the latch and encoding an output signal of the latch.

5. The device according to claim 4, wherein the latch comprises a plurality of flip-flops for latching signals from the first switch and first and second inverters coupled to the flip-flops and connected to each other in series.

6. The device according to claim 4, wherein the encoder comprises an exclusive OR gate, an NAND gate, and an OR gate.

7. The device according to claim 5, wherein the reference voltage generator, the first and second switches, and the latch generate and latch $2^N$ signals when sensing data of N bits.

8. A data sensing method of a multi-bit memory cell comprising the steps of:

providing a control gate of the memory cell with a voltage, the voltage being increased linearly;

comparing a drain voltage of the memory cell with a reference voltage;

generating a sensing signal when the drain voltage of the memory cell is lower than the reference voltage;

detecting synchronously the control gate voltage with the sensing signal; and converting the detected voltage into a digital value.

9. The method according to claim 8, further including the step of regulating the speed of sensing and slope of the output voltage in a voltage generator to offset a delay in generating the sensing signal.

10. The method according to claim 8, further comprising the steps of:

providing the control gate of the memory cell with a voltage, the voltage decreased linearly;

comparing the drain voltage of the memory cell with a reference voltage; and generating a sensing signal when the drain voltage is higher than the reference voltage.

* * * * *